(12) United States Patent
Jang et al.

(10) Patent No.: US 8,237,154 B2
(45) Date of Patent: Aug. 7, 2012

(54) COMPOSITE LIGHT-EMITTING MATERIAL AND LIGHT-EMITTING DEVICE COMPRISING THE SAME

(75) Inventors: Eun Joo Jang, Suwon-si (KR); Shin Ae Jun, Seongnam-si (KR); Jung Eun Lim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1352 days.

(21) Appl. No.: 11/621,269

(22) Filed: Jan. 9, 2007

(65) Prior Publication Data

US 2008/0121844 A1    May 29, 2008

(30) Foreign Application Priority Data

Aug. 21, 2006 (KR) .................. 10-2006-0078707

(51) Int. Cl.
*H01L 51/00* (2006.01)

(52) U.S. Cl. ..... 257/40; 257/79; 257/103; 257/E33.001; 257/E33.06; 257/E51.001; 257/E51.047; 428/384; 428/842.5

(58) Field of Classification Search .............. 257/40, 257/79, 103, E51.001, E51.047, E33.001, 257/E33.06; 428/384, 842.5
See application file for complete search history.

(56) References Cited

U.S. PATENT DOCUMENTS

| | | | | |
|---|---|---|---|---|
| 5,985,173 | A * | 11/1999 | Gray et al. | 252/301.4 R |
| 7,495,383 | B2 * | 2/2009 | Chua et al. | 313/503 |
| 7,790,473 | B2 * | 9/2010 | Barchi et al. | 436/532 |
| 2003/0148379 | A1 * | 8/2003 | Roitman et al. | 435/7.1 |
| 2006/0240227 | A1 * | 10/2006 | Zhang et al. | 428/195.1 |
| 2010/0044636 | A1 * | 2/2010 | Ramprasad et al. | 252/301.6 S |

FOREIGN PATENT DOCUMENTS

KR    10-2000-0008995    2/2000

OTHER PUBLICATIONS

Baldo et al., "Very high-efficiency green organic light-emitting devices based on electrophosphorescence", Applied Physics Letters, vol. 75, No. 1, Jul. 5, 1999, pp. 3-6.

* cited by examiner

*Primary Examiner* — Anthony Ho
(74) *Attorney, Agent, or Firm* — Cantor Colburn LLP

(57) ABSTRACT

Disclosed herein are a composite light-emitting material, which includes two or more light-emitting materials selected from an inorganic phosphor, a semiconductor nanocrystal and an organic dye in which the surfaces of the two or more light-emitting materials are coated; and a light-emitting device comprising the same, so as to improve the luminous efficiency and lifetime.

23 Claims, 7 Drawing Sheets

COMPOSITE LIGHT-EMITTING MATERIAL AND LIGHT-EMITTING DEVICE COMPRISING THE SAME

This non-provisional application claims priority to Korean Patent Application No. 10-2006-0078707 filed on Aug. 21, 2006, and all the benefits accruing therefrom under 35 U.S.C. §119, the contents of which are herein incorporated by reference in its entirety.

BACKGROUND OF THE INVENTION

1. Field of the Invention

The present invention relates to a composite light-emitting material and a light-emitting device comprising the same. More particularly, the present invention relates to a composite light-emitting material comprising two or more light-emitting materials of an inorganic phosphor, a semiconductor nanocrystal and an organic dye in which the surfaces of the two or more light-emitting materials are coated, and a light-emitting device comprising the same.

2. Description of the Related Art

Light-emitting materials exhibiting emission properties caused by an energy stimulus have been widely used in display devices such as light source devices, cathode ray tubes, plasma displays or field emission displays, and light-emitting sensors for bio-tagging. There is a need for a light-emitting device to employ a light-emitting material capable of maximizing luminous efficiency and stably maintaining the emission properties. Representative examples of light-emitting materials for a display device include an inorganic phosphor, an organic dye, a semiconductor nanocrystal and the like.

Among them, the semiconductor nanocrystal ("quantum dot") is prepared by pulverizing a semiconductor compound into a nano-sized crystal, which exhibits a quantum confinement effect in a smaller range than the bulk exciton Bohr radius of the semiconductor compound, thereby leading to a change in band gap energy of the semiconductor compound.

The luminous efficiency of the light-emitting material depends on the surface characteristics such as surface structure, composition, or surface crystallinity of a light-emitting material particle. Since the semiconductor nanocrystal has a relatively large surface area due to its very small size, it is apt to raise any defects on the surface thereof. These defects function as various energy traps in the band gap energy, thereby lowering the luminous efficiency of the semiconductor nanocrystal. Moreover, this phenomenon becomes more serious if semiconductor nanocrystals are combined.

In the case of the inorganic phosphor, its emission property tends to change easily by oxidizing the surface thereof due to the contact with oxygen and moisture. Further, when electrons continuously accumulate on the surface, it is hard to get them to an excitation state owing to the charging thereof, which may lead to the reduction in the luminous efficiency.

Meanwhile, in the case of the organic dye used as a light-emitting material, if it is exposed to excitation light having high energy for a long time, the safety of the material itself is lowered, thereby significantly decreasing the luminous efficiency.

As described above, since the structure of the light-emitting material is affected by the property of the material, environmental conditions, energy excitation state, and the like, its emission properties may be changed or luminous efficiency may be deteriorated. Therefore, a coating method for wrapping a protecting film on the surface of the light-emitting material with a stable organic or inorganic material has been used. Further, methods for coating the surface of a phosphor particle with a protecting material include a sol-gel method, a liquid phase coating method such as an absorption method based on an electrostatic principle in a solution, and the like.

One method includes coating the surface of a semiconductor nanocrystal with a semiconductor compound having high band gap energy.

Hitherto, however, there was no prior art for combining two or more light-emitting materials into a single structure by fusing them so as to improve the luminous efficiency and lifetime of a light-emitting material.

BRIEF SUMMARY OF THE INVENTION

Therefore, the present invention has been made in view of the above-described problems, and one aspect of the present invention includes providing a composite light-emitting material which is capable of simplifying the procedure for applying the light-emitting material to a light-emitting device and of efficiently regulating the characteristics of the light-emitting device by combining two or more light-emitting materials into a single structure through fusion.

Another aspect of the present invention includes providing a light-emitting device which can be easily prepared, and can show excellent reproducibility and stably exhibit superior emission properties.

According to an exemplary embodiment, a composite light-emitting material includes two or more light-emitting materials of an inorganic phosphor, a semiconductor nanocrystal and an organic dye in which the surfaces of the two or more light-emitting materials are coated.

According to another exemplary embodiment, a light-emitting device includes the composite light-emitting material.

BRIEF DESCRIPTION OF THE DRAWINGS

The above and other aspects, features, and other advantages of the present invention will be more clearly understood from the following detailed description taken in conjunction with the accompanying drawings, in which.

DETAILED DESCRIPTION OF THE INVENTION

Figure 1:
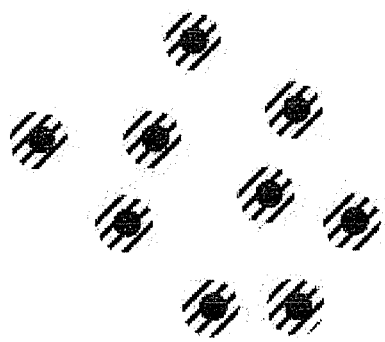
FIG. 1 is a schematic illustration of an exemplary embodiment of a structure of a composite light-emitting material in which the surface of a semiconductor nanocrystal is coated with a transparent metal oxide containing an organic dye.

Hereinafter, the present invention will be described more fully with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and/or combination of the foregoing, but do not preclude the presence and/or addition of one or more other features, integers, steps, operations, elements, components, groups, and/or combination of the foregoing.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an exemplary embodiment of the present invention, the composite light-emitting material is characterized by having two or more light-emitting materials of an inorganic phosphor, a semiconductor nanocrystal, and an organic dye in which the surfaces of the two or more light-emitting materials are coated.

The inorganic phosphor may be coated with a transparent material such as a metal oxide so as to provide increased safety after synthesis, and the organic dye may be used in the form of a composite by encapsulating in a transparent material such as a metal oxide in order to overcome the problem of the reduction in lifetime caused by the exposure to an excitation light source. Further, the semiconductor nanocrystal may be coated with a metal oxide to assist in preventing the formation of surface defects due to environmental changes.

The composite light-emitting material of the present invention employs the mixture of an inorganic phosphor, a semiconductor nanocrystal and an organic dye so as to compensate for merits and demerits of each component. For example, since the organic dye exhibits the greatest luminous efficiency but has a disadvantage in maintaining stability, it is possible to obtain a powerful light-emitting material exhibiting excellent luminous efficiency while having a prolonged lifetime when using the organic dye with a semiconductor nanocrystal or inorganic phosphor. Further, it is capable of effectively controlling color conversion by using an energy transfer phenomenon that occurs at a near distance.

According to an exemplary embodiment of the present invention, the composite light-emitting material comprises an organic dye and a semiconductor nanocrystal in a transparent metal oxide matrix. In such a structure, the semiconductor nanocrystal and the organic dye used as light-emitting materials are coated with the metal oxide, thereby stably maintaining emission properties without the occurrence of defects on the surface and the reduction in the luminous efficiency due to environmental conditions.

The composite light-emitting material of the present invention may have a structure that comprises a core material and a transparent coating layer. The core material may be an inorganic phosphor or a semiconductor nanocrystal, and the transparent coating layer formed on an outer side of the core material may comprise any one or both of the semiconductor nanocrystal and organic dye in a matrix. Here, the semiconductor nanocrystal included in the transparent coating layer may be additionally coated itself. The matrix may be formed from either a transparent metal oxide or a polymer so long as it can transmit visible rays.

The core material and the transparent coating layer of the composite light-emitting material of the present invention may be implemented in the form of various kinds of compositions. For example, if the core material is a semiconductor nanocrystal, the transparent coating layer coated on the surface of the semiconductor nanocrystal may be a metal oxide containing an organic dye.

In another exemplary embodiment of the present invention, if the core material is an inorganic phosphor, the transparent coating layer may comprise any one or both of the semiconductor nanocrystal and organic dye in the transparent matrix. Further, the semiconductor nanocrystal used in the present invention may be coated with transparent metal oxide. For example, the transparent coating layer may comprise the semiconductor nanocrystal coated with the transparent metal oxide in the transparent metal oxide matrix.

Meanwhile, the semiconductor nanocrystal in the transparent coating layer may be coated with the transparent metal oxide containing an organic dye therein. In such a case, the composite light-emitting material has a structure in which the transparent coating layer is formed on the surface of the inorganic phosphor and contains the semiconductor nanocrystal coated with the transparent metal oxide comprising an organic dye in the transparent metal oxide matrix. Alternatively, the transparent coating layer may comprise both the semiconductor nanocrystal coated with the transparent metal oxide containing an organic dye and the organic dye in the transparent metal oxide matrix.

The following are a variety of exemplary embodiments of the composite light-emitting material according to the present invention shown in FIGS. 1 to 7.

FIG. 1 is a schematic illustration of an exemplary embodiment of a structure of a composite light-emitting material in which the surface of a semiconductor nanocrystal is coated with a transparent metal oxide containing an organic dye. As illustrated in FIG. 1, the semiconductor nanocrystal and the organic dye are combined by coating the surface of the semiconductor nanocrystal with the transparent metal oxide containing the organic dye, and thus are coated with the metal oxide.

Figure 2:
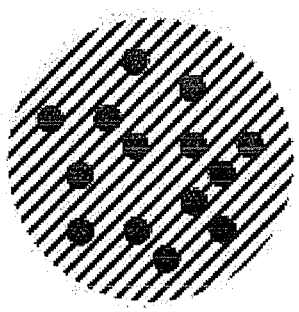
FIG. 2 is a schematic illustration of an exemplary embodiment of a structure of a composite light-emitting material comprising an organic dye and a semiconductor nanocrystal in a transparent metal oxide matrix.

FIG. 2 is a schematic illustration of an exemplary embodiment of a structure of a composite light-emitting material comprising an organic dye and a semiconductor nanocrystal in a transparent metal oxide matrix. In the composite light-emitting material having such a structure, the semiconductor nanocrystal and the organic dye are coated with the transparent metal oxide.

Figure 3:
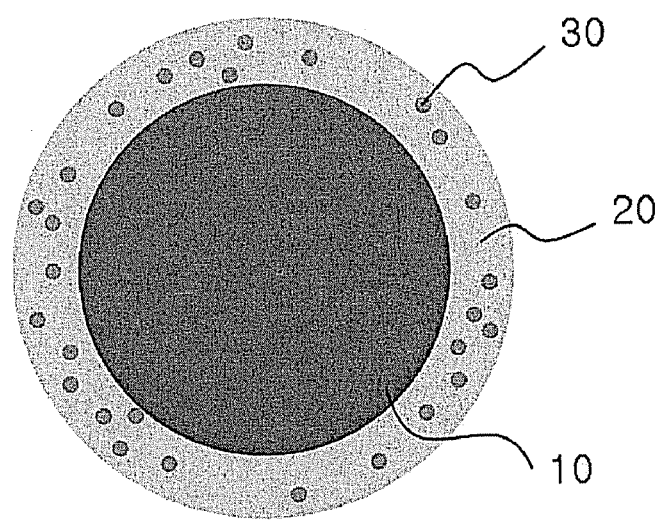
FIG. 3 is a schematic illustration of an exemplary embodiment of a structure of a composite light-emitting material in which the surface of an inorganic phosphor is coated with a coating layer containing a semiconductor nanocrystal.

FIG. 3 is a schematic illustration of an exemplary embodiment of a structure of a composite light-emitting material in which the surface of an inorganic phosphor is coated with a coating layer containing a semiconductor nanocrystal. The composite light-emitting material shown in FIG. 3 has a structure in which a transparent coating layer is formed on the surface of the inorganic phosphor 10, and is composed of a transparent metal oxide containing a semiconductor nanocrystal 30 or an organic polymer matrix 20. Such a composite light-emitting material may be prepared by making a precursor of the metal oxide into a sol state, which is formed from a partial condensation reaction using a catalyst such as an acid or a base, mixing the precursor with the semiconductor nanocrystal, and then coating the resulting solution on the surface of the inorganic phosphor. Alternatively, after the surface of the semiconductor nanocrystal is modified with a precursor of the metal oxide, the inorganic phosphor may be coated by adding it to the precursor while conducting the condensation reaction. Further, the inorganic phosphor may be coated by adding it to a solution prepared by dissolving a semiconductor nanocrystal and an organic polymer, or after preparing a solution by mixing a semiconductor nanocrystal with a monomer or an oligomer and adding a catalyst capable of stimulating a polymerization reaction thereto, by adding the inorganic phosphor to the reaction solution during the polymerization reaction.

Figure 4:
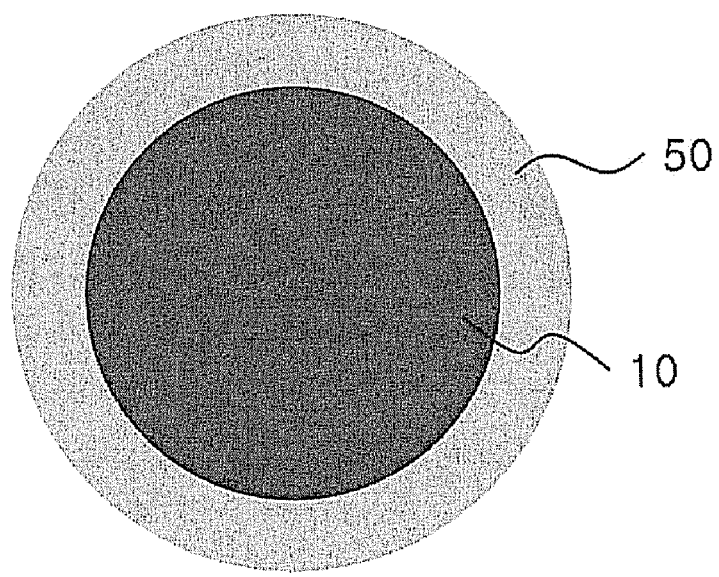
FIG. 4 is a schematic illustration of an exemplary embodiment of a structure of a composite light-emitting material in which the surface of an inorganic phosphor is coated with a coating layer containing an organic dye.

FIG. 4 is a schematic illustration of an exemplary embodiment of a structure of a composite light-emitting material in which the surface of an inorganic phosphor is coated with a coating layer containing an organic dye. As shown in FIG. 4, in the composite light-emitting material, the coating layer formed on the surface of the inorganic phosphor 10 may comprise a transparent metal oxide 50 containing an organic dye.

In the case of forming a coating layer using an organic dye, after determining the desired concentration of the organic dye, it is pre-mixed with a precursor of the metal oxide used in the preparation of the composite material, and then, a common process for preparing a composite material is carried out to form a transparent coating layer containing the transparent metal oxide having the organic dye. For example, in preparing a silica composite, a precursor of the silica composite and an organic dye are mixed, and the organic dye is encapsulated in a transparent material such as a metal oxide.

Figure 5:
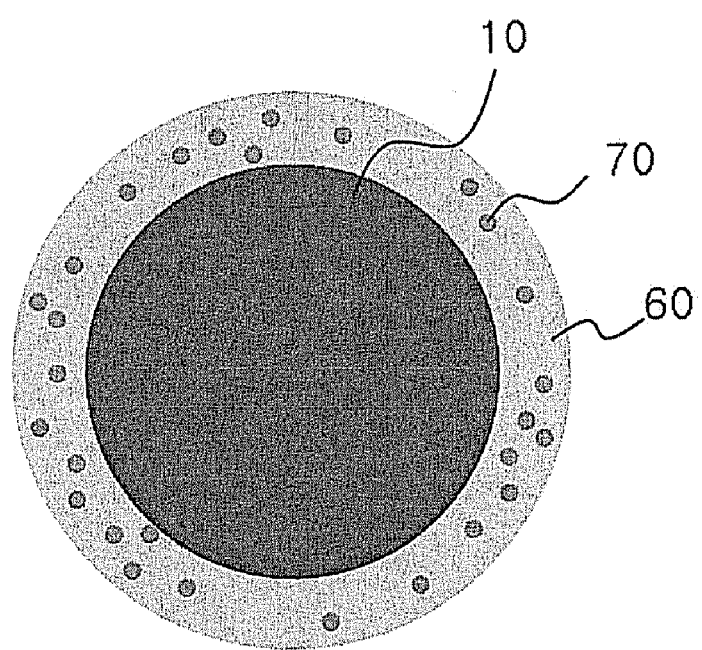
FIG. 5 is a schematic illustration of an exemplary embodiment of a structure of a composite light-emitting material in which the surface of an inorganic phosphor is coated with a coating layer containing a semiconductor nanocrystal and an organic dye.

FIG. 5 is a schematic illustration of an exemplary embodiment of a structure of a composite light-emitting material in which the surface of an inorganic phosphor is coated with a transparent coating layer comprising a semiconductor nanocrystal and an organic dye. Referring to FIG. 5, the composite light-emitting material contains both the semiconductor nanocrystal 70 and the organic dye in the transparent coating layer 60 formed on the surface of the inorganic phosphor 10.

In preparing the composite light-emitting material according to such an embodiment, the inorganic phosphor is coated with the mixture, which is prepared by mixing the semiconductor nanocrystal and the organic dye with a precursor of the transparent metal oxide. At this time, in order to perform a separate polymerization process, it is desirable to employ a catalyst such as an acid or a base. After the precursor of the metal oxide is made into a sol state during a partial condensation reaction by using the catalyst, it is mixed with the semiconductor nanocrystal and the organic dye, and then, the resulting mixture is used for coating the inorganic phosphor. The process includes maintaining the reaction mixture at a specific temperature or specific stirring conditions.

Figure 6:
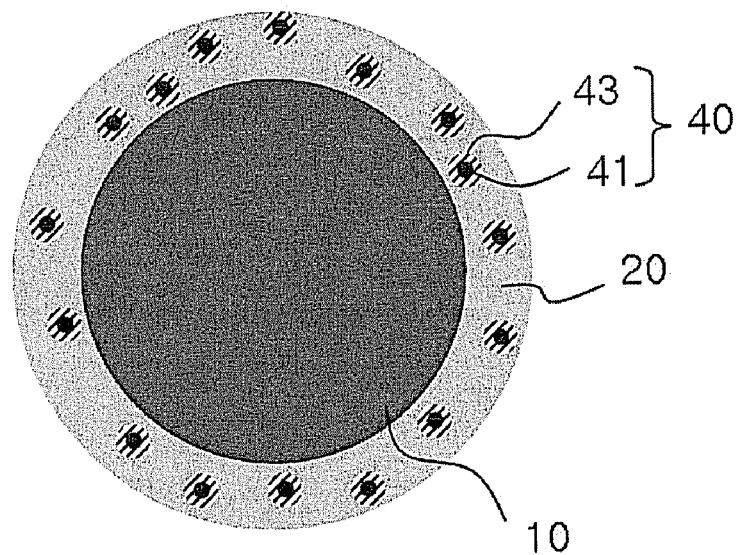
FIG. 6 is a schematic illustration of an exemplary embodiment of a structure of a composite light-emitting material in which the surface of an inorganic phosphor is coated with a transparent metal oxide containing a semiconductor nanocrystal coated with a coating layer containing an organic dye.

FIG. 6 is a schematic illustration of an exemplary embodiment of a structure of a composite light-emitting material in which the surface of an inorganic phosphor is coated with a transparent metal oxide comprising a semiconductor nanocrystal, which is coated with a coating layer containing an organic dye. Referring to FIG. 6, the composite light-emitting material contains a surface-coated semiconductor nanocrystal 40 with the transparent coating layer formed around the inorganic phosphor 10 in a transparent metal oxide matrix 20. The surface-coated semiconductor nanocrystal 40 is prepared by coating the surface of a semiconductor nanocrystal 41 with a metal oxide 43 containing the organic dye.

Figure 7:
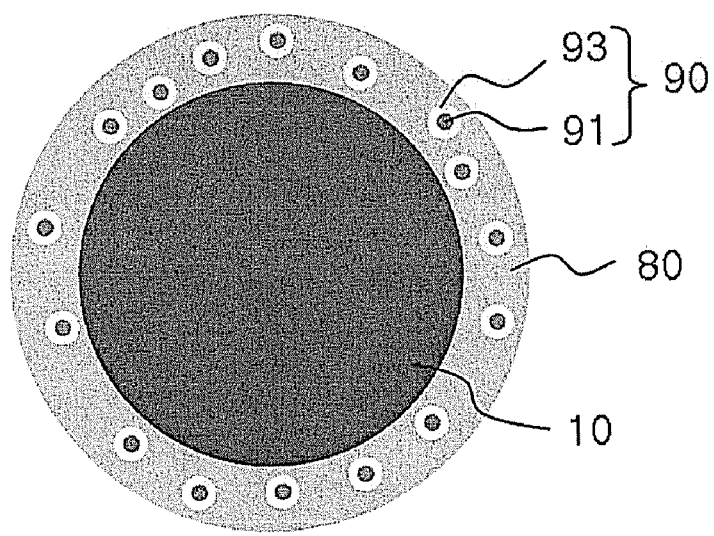
FIG. 7 is a schematic illustration of an exemplary embodiment of the structure of a composite light-emitting material in which the surface of an inorganic phosphor is coated with a coating layer comprising a semiconductor nanocrystal coated with a transparent metal oxide and an organic dye.

FIG. 7 is a schematic illustration of an exemplary embodiment of a structure of a composite light-emitting material in which the surface of an inorganic phosphor is coated with a coating layer containing a semiconductor nanocrystal, which is coated with a transparent metal oxide and an organic dye. Referring to FIG. 7, the composite light-emitting material comprises the inorganic phosphor 10 and the transparent coating layer formed on the surface thereof, wherein the transparent coating layer contains a surface-coated semiconductor nanocrystal 90 in a metal oxide matrix 80 having the organic dye, and the surface-coated semiconductor nanocrystal 90 is prepared by coating the surface of the semiconductor nanocrystal 91 with the transparent metal oxide 93.

The transparent metal oxide may be one or more selected from the group consisting of titanium oxide, niobium oxide, hafnium oxide, indium oxide, tungsten oxide, tin oxide and zinc oxide, but is not limited thereto. These metal oxides may be used alone or in the form of a mixture. Specific metal oxides include $TiO_2$, $SiO_2$, $SnO_2$, $ZnO$, $WO_3$, $Nb_2O_5$, $TiSrO_3$, $InTiO_2$ and the like.

In the above-described embodiments, the matrix of the transparent coating layer formed on the surface of the inorganic phosphor may comprise any material selected from the group consisting of a monomer, an oligomer, and a polymer, in addition to the above-mentioned metal oxides.

When using a polymer, the composite light-emitting material may be prepared by dissolving the transparent polymer in a solvent, mixing it with a semiconductor nanocrystal or an organic dye, coating the resulting mixture on the surface of an inorganic phosphor, and removing the solvent by evaporation. There is no limitation on the solvent used in the present invention, but particular examples of the solvent may include an aliphatic solvent such as toluene or chlorobenzene; a normal alkane solvent such as hexane or octane; an non-polar solvent such as methylene chloride or chloroform; an alcohol solvent such as ethanol, propanol, or butanol; and a polar solvent such as dimethylformamide or tetrahydrofuran.

When using a monomer as the matrix material, after a semiconductor nanocrystal or an organic dye is mixed with the monomer, a catalyst, a crosslinking agent, an initiator, and the like and subjected to polymerization, the resulting mixture is coated on the surface of an inorganic phosphor. In such a case, it is desirable to add the catalyst to the reaction mixture and maintain a specific reaction temperature and/or stirring during the reaction.

In case of the monomer or oligomer, for example, methyl methacrylate (MMA) monomer may be mixed with a semiconductor nanocrystal or an organic dye and polymerized into polymethyl methacrylate (PMMA). If lauryl methacrylate (LMA) monomer is used, polylauryl methacrylate can be polymerized. In the same manner, styrene monomer may be polymerized into polystyrene, which can be used for constructing the matrix.

The polymer employable in the present invention may be one or more selected from the group consisting of polycarbonate, polyvinyl carbazole, polymethyl methacrylate, polylauryl methacrylate, polystyrene and polyethylene terephthalate, but is not limited thereto.

There is no limitation on the choice of inorganic phosphor so long as it can emit light; and various kinds of phosphors including a red phosphor, a green light-emitting material, a blue light-emitting material, a white light-emitting material and a yellow light-emitting material may be selectively employed based on an emission wavelength to be obtained. Particular examples of the inorganic phosphor used in the present invention may be one or more selected from the group consisting of $(Y,Gd)BO_3$:Eu, $Y(V,P)O_4$:Eu, $(Y,Gd)O_3$:Eu, $La_2O_2S$:Eu$^{3+}$, $Mg_4(F)GeO_8$:Mn, $Y_2O_3$:Ru, $Y_2O_2S$:Eu, $K_5Eu_{2.5}(WO_4)_{6.25}$:Sm$_{0.08}$, $YBO_3SrS$:Eu$^{2+}$, $BaMgAl_{10}O_{17}$:Eu,Mn, $Zn_2SiO_4$:Mn, $(Zn,A)_2SiO_4$:Mn (where A is an alkali-earth metal), $MgAlxOy$:Mn (where x is an integer from 1 to 10 and y is an integer from 1 to 30), $LaMgAlxOy$:Tb (where x is an integer from 1 to 14 and y is an integer from 8 to 47), $ReBO_3$:Tb (where Re is one or more elements selected from the group consisting of Sc, Y, La, Ce and Gd), $ZnS$:Cu:Al, $SrGa_2S_4$:Ru, $Tb(SrGa_2S_4$:Eu$^{2+})$, and $(Y,Gd)BO_3$:Tb.

The semiconductor nanocrystal used in the present invention may be selected from the group consisting of a II-VI family compound, a III-V family compound, a IV-VI family compound, a IV family compound and a mixture thereof, but is not limited thereto. Further, the semiconductor nanocrystal may have a core-shell structure or be an alloy.

Nonrestrictive examples of II-VI family compounds include a binary compound such as CdSe, CdTe, ZnS, ZnSe, ZnTe, ZnO, HgS, HgSe or HgTe; a tertiary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and a quaternary compound such as HgZnTe, CdZnSeS, CdZnSeTe, CdZnSTe, CdHgSeS, CdHgSeTe, CdHgSTe, HgznSeS, HgZnSeTe and HgZnSTe.

Nonrestrictive examples of III-V family compounds include a binary compound such as GaN, GaP, GaAs, GaSb, AlN, AlP, AlAs, AlSb, InN, InP, InAs and InSb; a tertiary compound such as GaNP, GaNAs, GaNSb, GaPAs, GaPSb, AlNP, AlNAs, AlNSb, AlPAs, AlPSb, InNP, InNAs, InNSb, InPAs, and InPSb; and a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb.

Nonrestrictive examples of IV-VI family compounds include a binary compound such as SnS, SnSe, SnTe, PbS, PbSe and PbTe; a tertiary compound such as SnSeS, SnSeTe, SnSTe, PbSeS, PbSeTe, PbSTe, SnPbS, SnPbSe and SnPbTe; and a quaternary compound such as SnPbSSe, SnPbSeTe and SnPbSTe.

Nonrestrictive examples of IV family compounds include Si and Ge; and binary compounds such as SiC and SiGe.

The organic dye employable in the present invention may include both of an organic fluorescent dye and an organic phosphorescent dye, and an organic metal complex or an organic substance dye can be used as the organic dye. There is no limitation on the choice of organic dye so long as it can exhibit an emission property. Particular examples of the organic dye may include an organic dye in the form of an organic metal complex such as, for example, tris(2-phenylpyridine) iridium[Ir(ppy)], or an organic dye composed of only an organic substance such as coumarin, Rhodamine, phenoxazone, stilbene, terphenyl or quarterphenyl.

A light-emitting device can be made from the composite light-emitting material. For example, the composite light-emitting material of the present invention can be effectively used in the formation of a light-emitting layer of an electric light-emitting device, and also be applied to a light-emitting device such as a light-emitting diode (LED). In particular, the composite light-emitting material of the present invention exhibits good characteristics of excellent luminous efficiency and prolonged lifetime, and therefore, it can be used as a phosphor of an LED having ultraviolet rays and a blue light source, and also be applied to a white LED.

Since light-emitting devices such as an LED are manufactured with environmentally-friendly materials and has many advantages of prolonged lifetime, high reliability, high discernment, low power dissipation, compactness, and the like, they can been widely utilized in various fields. For example, LEDs have been used in instrument panels, signal lamps of vehicles, backlights of digital cameras within cellular telephones, vehicle room lamps, exterior large displays, displays for airplane control rooms, LED lighting, LED signs, and the like.

The light-emitting device of the present invention can be manufactured by common methods for preparing a light-emitting device such as an LED, without requiring any specific equipment or techniques. For example, an LED may be manufactured by surrounding a blue LED chip displaced at a lead frame with a transparent matrix dispersed with an inorganic phosphor, a semiconductor nanocrystal or an organic dye; and sealing the transparent matrix, a wire, and the lead frame with a sealing resin.

The present invention will now be described in more detail with reference to the following examples. However, these examples are given for the purpose of illustration and are not to be construed as limiting the scope of the invention.

EXAMPLES

Preparation Example 1

Preparation of Semiconductor Nanocrystals

About 32 grams (g) of trioctylamine (hereinafter, referred to as "TOA"), about 1.8 g of oleic acid and about 1.6 millimoles (mmol) of cadmium oxide were simultaneously added to a 125 milliliter (ml) flask equipped with a reflux condenser and stirred at a controlled reaction temperature of about 300 degrees Celsius (° C.). About 2 ml of a 2 molar (M) Se-TOP (trioctylphosphate) complex solution was rapidly added to the reaction mixture, and about 90 seconds after the addition, about 0.08 mmol of an octylthiol complex solution mixed with about 6 ml of TOA was gradually poured thereto. After the reaction for about 40 minutes, about 16 ml of a zinc oleate complex solution that was separately prepared was gradually added to the resulting reaction mixture.

The zinc oleate complex solution was prepared by adding about 4 mmol of zinc acetate, about 2.8 g of oleic acid and about 16 g of TOA to a 125 ml flask equipped with a reflux condenser and stirring the mixture at a controlled reaction temperature of about 200° C. The zinc oleate complex solution thus prepared was cooled down to about 100° C. or below and added to the reaction mixture. After the addition of the zinc oleate complex solution was completed, about 6.4 mmol of the octylthiol complex solution mixed with about 6 ml of TOA was gradually added to the resulting mixture immediately and reacted for about 2 hours. Through the above procedure, CdSe nanocrystals were generated first, then CdS nanocrystals were grown on the surface thereof, and ZnS nanocrystals were finally grown thereon once more.

After the reaction was completed, the temperature of the reaction mixture was cooled down to room temperature as fast as possible, ethanol as a non-solvent was added thereto, and then the mixture was subjected to centrifugation to separate the precipitate. The precipitate so obtained was dispersed in toluene, to obtain CdSe/CdS/ZnS nanocrystals having a multi-layer structure of about 8 nanometers (nm) in a diameter.

Figure 8:
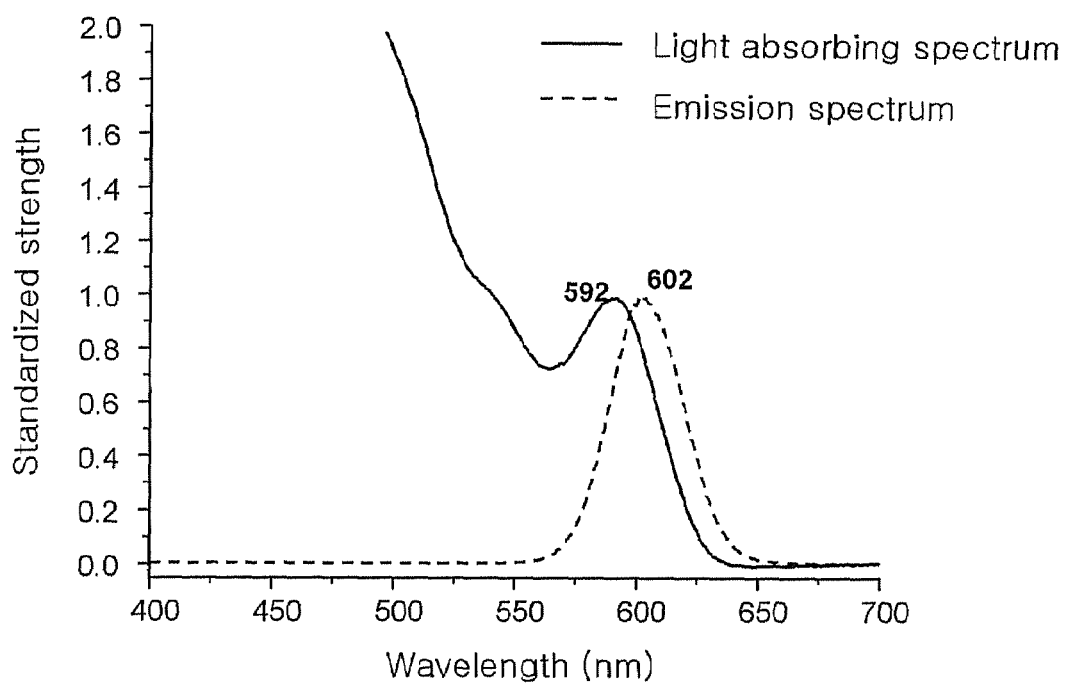
FIG. 8 is a UV-VIS absorption spectrum of an exemplary embodiment of a red light-emitting semiconductor nanocrystal prepared according to Example 1 and a light excitation emission spectrum excited with ultraviolet rays thereof.

A UV-VIS absorption spectrum of the red light-emitting semiconductor nanocrystals prepared in Preparation Example 1 and a light excitation emission spectrum excited with ultraviolet rays thereof are shown in FIG. 8.

Example 1

Preparation of a Composite Light-Emitting Material

After about 100 milligrams (mg) of the red light-emitting semiconductor nanocrystal prepared in Preparation Example 1 was separated by centrifugation, about 205 mg of 5-amino-1-pentanol being present in the amount of about 50 percent (%) by weight in ethanol was added thereto, and the mixture was stirred at room temperature for about 30 minutes so as to be evenly dispersed. About 300 mg of ethanol was added to the stirred mixture and further stirred again at room temperature for about 30 minutes, to obtain a solution in which the semiconductor nanocrystals are dispersed homogeneously. About 10 mg of triethoxysilylpropyl isocyanate was again added to the solution followed by adding about 50 mg of 3-aminopropyltrimethoxysilane thereto. The resulting mixture was stirred at room temperature for about 5 minutes, mixed with about 0.2 g of a green light-emitting phosphor TG-3540 (manufactured by Sarnoff Corporation), and then further stirred at room temperature for about 2 hours. About 20 ml of a 1:1 mixture of toluene and ethanol was added to the stirred solution and subjected to centrifugation to separate a precipitate. The precipitate so obtained was heated to about 150° C., to thereby obtain a composite light-emitting material.

Figure 9:
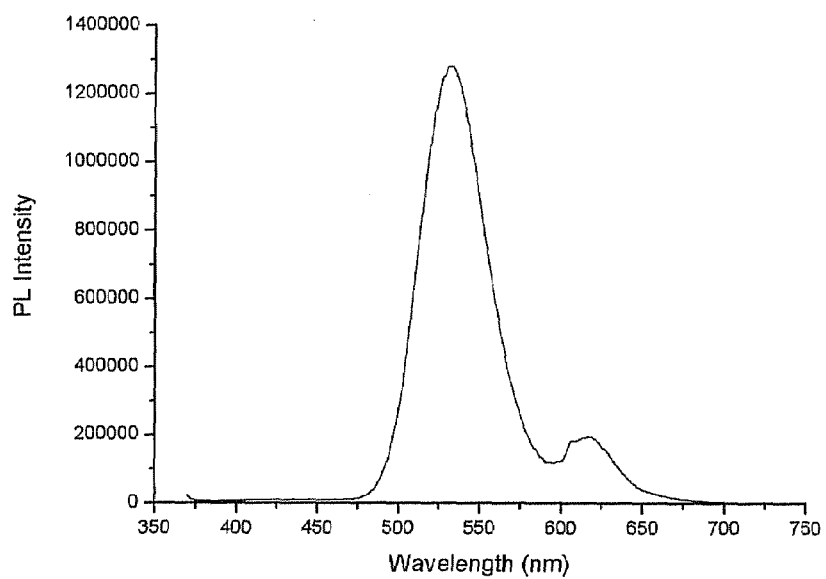
FIG. 9 is a light excitation emission spectrum of an exemplary embodiment of a composite light-emitting material prepared in Example 2.
Figure 10:
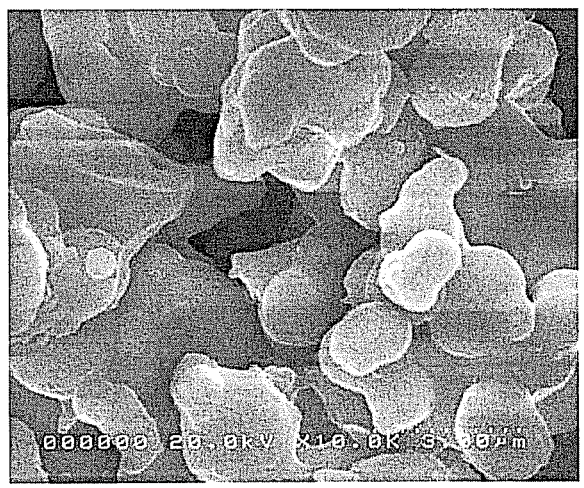
FIG. 10 is a scanning electron microscope (SEM) image of an exemplary embodiment of a composite light-emitting material prepared according to Example 2.

A light excitation emission spectrum and a scanning electron microscope (SEM) image of the composite light-emitting material prepared above are shown in FIGS. 9 and 10, respectively. It can be confirmed from FIG. 9 that the composite light-emitting material prepared according to this example simultaneously reveals both emission properties of the inorganic phosphor and the semiconductor nanocrystal. From FIG. 10, it can be seen that the surface of the inorganic phosphor is uniformly coated with a silica coating layer.

Example 2

Preparation of a Composite Light-Emitting Material

Figure 11:
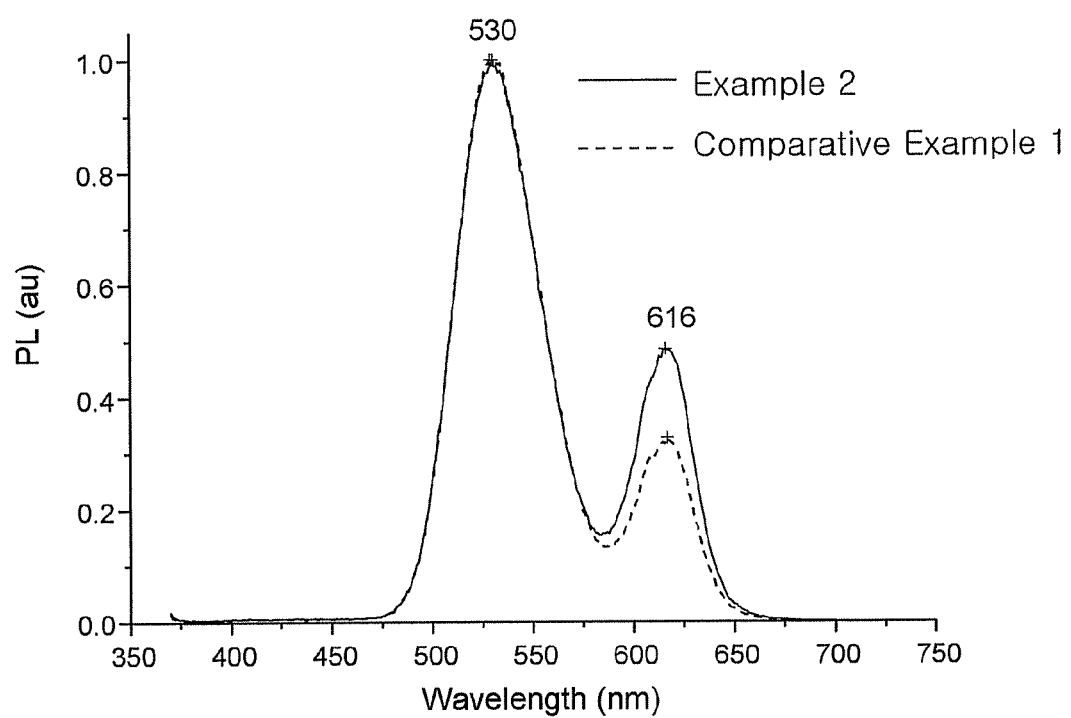
FIG. 11 is light excitation emission spectra of an exemplary embodiment of a composite light-emitting material prepared according to Example 2 and a simple mixture of two light-emitting materials prepared according to Comparative Example 1.
Figure 12:
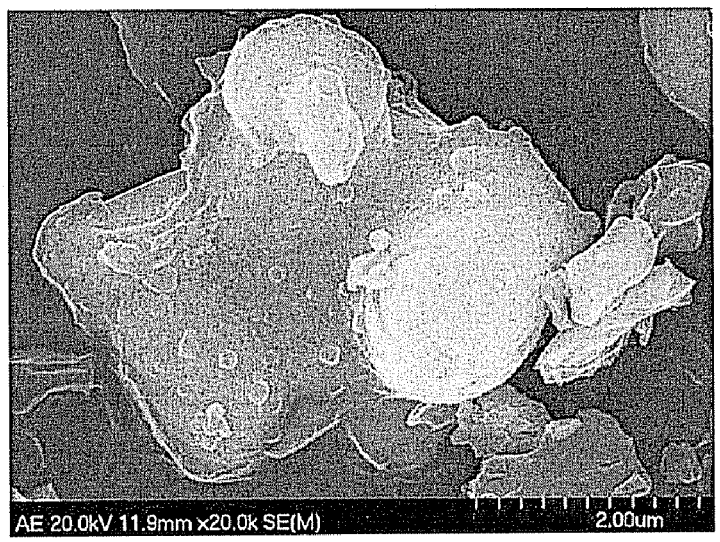
FIG. 12 is an SEM image of an exemplary embodiment of a composite light-emitting material prepared according to Example 2.

After about 100 mg of the red light-emitting semiconductor nanocrystal prepared in Preparation Example 1 was separated by centrifugation, it was dispersed in chloroform as a solvent in the amount of about 1% by weight. Separately, about 0.05 g of polymethyl methacrylate (PMMA) having a weight average molecular weight of about 15,000 was dissolved in about 2.5 ml of chloroform and sufficiently stirred at room temperature for about an hour or more. About 0.3 ml of the semiconductor nanocrystal solution prepared above was added to the PMMA solution and stirred so as to form a homogeneous mixture. About 0.2 g of a green light-emitting phosphor TG-3540 (manufactured by Sarnoff Corporation) was added to the mixture and further stirred at room temperature for about 2 hours. The stirred solution was centrifuged as-is to separate a precipitate. The precipitate thus obtained was heated to about 50° C. so as to evaporate the solvent, to obtain a composite light-emitting material. A light excitation emission spectrum and a SEM image of the composite light-emitting material prepared above are shown in FIGS. 11 and 12, respectively.

Comparative Example 1

Figure 13:
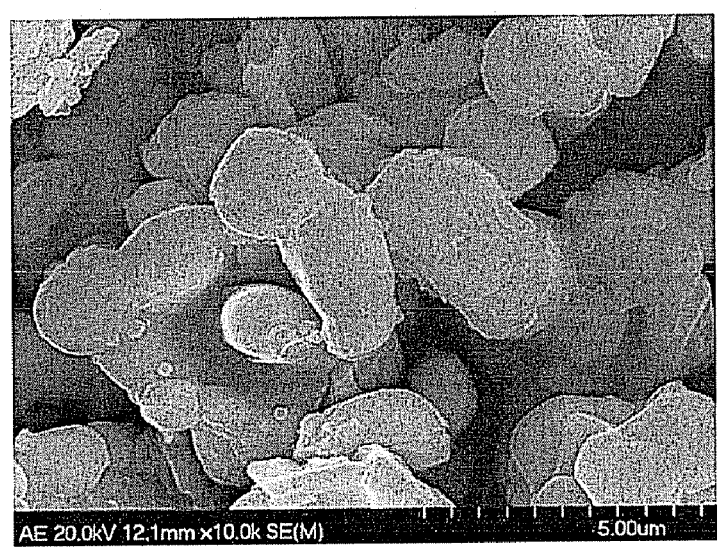
FIG. 13 is an SEM image of a simple mixture of two light-emitting materials prepared according to Comparative Example 1.

After about 100 mg of the red light-emitting semiconductor nanocrystal prepared in Preparation Example 1 was separated by centrifugation, it was dispersed in chloroform as a solvent in the amount of about 1% by weight. About 0.2 g of a green light-emitting phosphor TG-3540 (manufactured by Sarnoff Corporation) was added to the mixture and further stirred at room temperature for about 2 hours. The reaction mixture was centrifuged as it is to separate a simple mixture of an inorganic green light-emitting phosphor and a semiconductor nanocrystal. A light excitation emission spectrum and a SEM photograph of the simple mixture prepared above are shown in FIGS. 11 and 13, respectively. Referring to FIG. 11, it can be confirmed that the composite light-emitting material of the present invention shows superior emission properties to the light-emitting material mixture of Comparative Example 1 prepared by simply mixing two kinds of light-emitting materials.

Example 3

Preparation of LED

Figure 14:
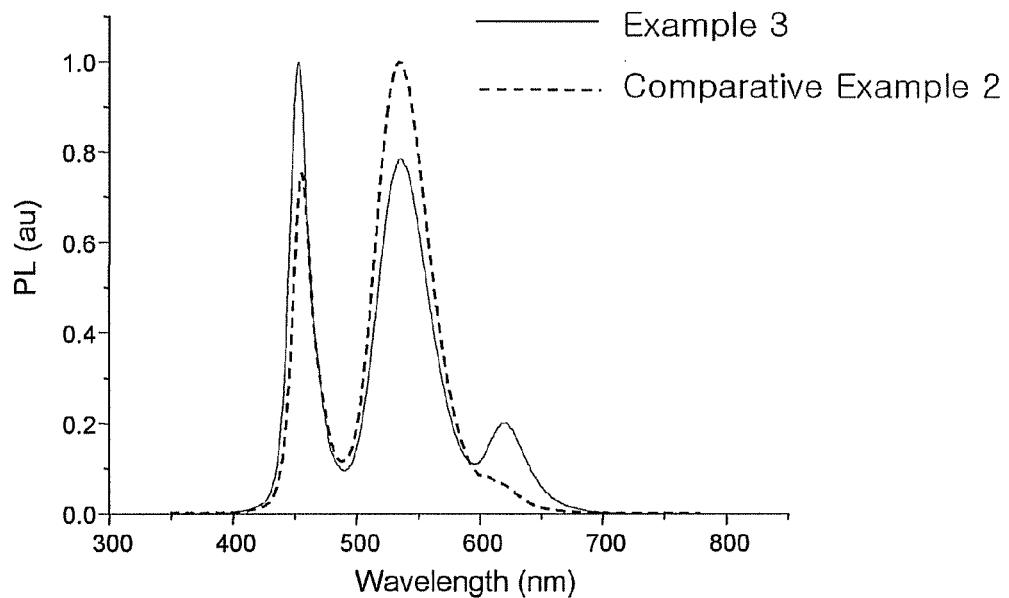
FIG. 14 includes light excitation emission spectra of light-emitting diodes prepared according to Example 3 and Comparative Example 2.

After about 0.025 g of the composite light-emitting material prepared in Example 1 was uniformly mixed with about 0.2 mlof epoxy (SJ4500 A/B Mixture by SJC Chemical), about 50 microliters (µl) of the resulting mixture in the form of a paste was coated on a blue LED chip (commercialized by Osram Gmbh) emitting blue light at about 460 nm. Then, the chip was cured in an oven at about 80° C. for about an hour. An emission spectrum of the LED thus prepared was measured with an ISP75 integrating sphere adaptor (manufactured by Instrument System) equipped with an integrating sphere and the result is shown in FIG. 14. The power conversion efficiency (PCE) was about 35%.

Comparative Example 2

In order to compare with the composite light-emitting material prepared in Example 1, about 50 µl of a paste prepared by homogeneously mixing about 0.025 g of a green light-emitting phosphor TG-3540 (manufactured by Sarnoff Corporation) with about 0.2 ml of epoxy was coated on an LED chip, and the chip was cured in an oven at about 120° C. for about an hour. About 50 µl of a semiconductor nanocrystal chloroform solution prepared in the amount of about 1% by weight was coated on the cured chip, and the chip was placed in an oven to evaporate the solvent. A light excitation emission spectrum of the LED prepared above is shown in FIG. 14 together. The PCE was about 22%.

Namely, in case of using the composite light-emitting material of the present invention, while it is capable of shortening one step in the curing process for preparing LED compared with the Comparative Example, the thus-prepared LED exhibits a higher light conversion efficiency than that prepared in the Comparative Example. In particular, it can be confirmed that the emission efficiency of the red light-emitting semiconductor nanocrystal is relatively more improved than the inorganic green light-emitting phosphor suggests that energy transfer converting the light absorbed into a green light-emitting material into a red light-emitting material is more efficiently performed.

Example 4

Preparation of LED

Figure 15:
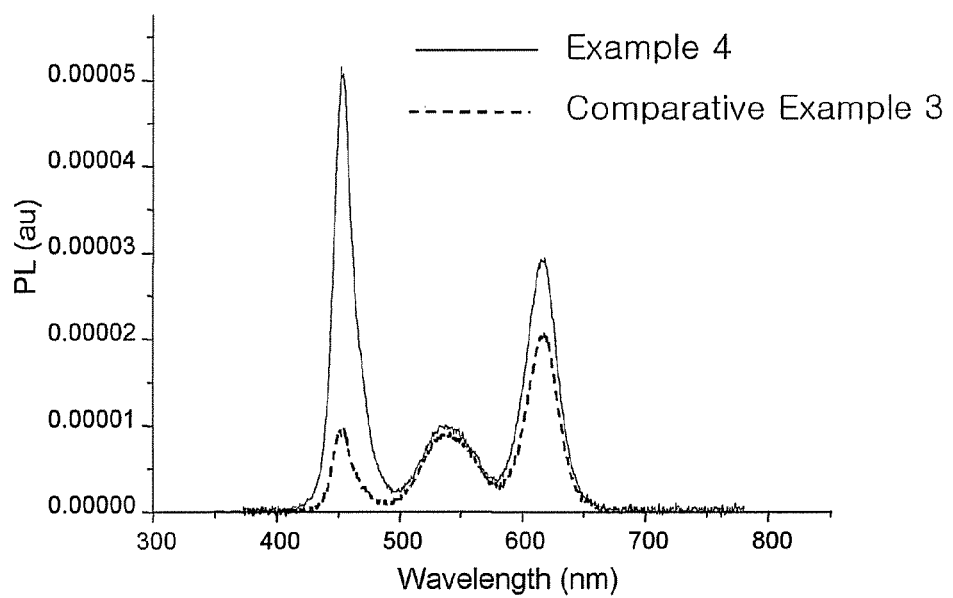
FIG. 15 includes light excitation emission spectra of light-emitting diodes prepared according to Example 4 and Comparative Example 3.

After about 0.025 g of the composite light-emitting material prepared in Example 2 was uniformly mixed with about 0.2 ml of epoxy (SJ4500 A/B Mixture by SJC Chemical), about 50 µl of the resulting mixture in the form of a paste was coated on a blue LED chip (commercialized by Osram Gmbh) emitting blue light at about 460 nm. Then, the chip was cured in an oven at about 80° C. for about an hour. An emission spectrum of the LED thus prepared was measured with an ISP75 integrating sphere adaptor (manufactured by Instrument System) equipped with an integrating sphere, and the result is shown in FIG. 15. The PCE was about 20%.

Comparative Example 3

In order to compare with the composite light-emitting material prepared in Example 2, about 50 µl of a paste prepared by homogeneously mixing about 0.025 g of a green light-emitting phosphor TG-3540 (manufactured by Sarnoff Corporation) with about 0.2 ml of epoxy was coated on a LED chip, and the chip was cured in an oven at about 120° C. for about an hour. About 50 µl of a semiconductor nanocrystal chloroform solution prepared in the amount of about 1% by weight was coated on the cured chip, and the chip was placed in an oven to evaporate the solvent. A light excitation emission spectrum of the LED prepared above is shown in FIG. 15. The PCE was about 11%.

As a result, in case of using the composite light-emitting material of the present invention, it can be confirmed that while it is capable of shortening one step in the curing process for preparing LED compared with Comparative Example, the thus-prepared LED exhibits about 2-fold higher light conversion efficiency than that prepared in this Comparative Example. This indicated that the light conversion efficiency was further improved by protecting the surface of the inorganic green light-emitting phosphor and the semiconductor nanocrystal well with PMMA polymer. When comparing the spectrums shown in FIG. 15, the composite light-emitting material prepared in Example 2 exhibited a larger blue wavelength corresponding to a light source than that of this Comparative Example, which means that the composite light-emitting material of the present invention shows similar strength of light-emitting while absorbing a smaller light source, thereby showing higher emission efficiency than that of this Comparative Example. In particular, the fact that the emission efficiency of the red light-emitting semiconductor nanocrystal is relatively more improved than the inorganic phosphor suggests that energy transfer converting the light absorbed into a green light-emitting material into a red light-emitting material is more efficiently performed.

As apparent from the foregoing, since the composite light-emitting material of the present invention can prevent the reduction in emission efficiencies of an inorganic phosphor, a semiconductor nanocrystal, and an organic dye caused by electron charging, environmental factors, or surface defects, it can show excellent luminous efficiency and maintain emission properties stably. Further, since the composite light-emitting material of the present invention is capable of maximizing energy transfer efficiency by properly combining an emission wavelength and a light absorbing wavelength of each light-emitting material, the luminous efficiency of the composite light-emitting material prepared according to the present invention can be significantly improved compared with the case of using each light-emitting material separately.

Furthermore, since the composite light-emitting material of the present invention combines two or more light-emitting materials into a single structure through fusion, the present invention can shorten the preparation process compared with the method for preparing a device by using each of several light-emitting materials showing different emission properties, and efficiently perform energy transfer, unlike the case of simply mixing light-emitting materials, thereby effectively regulating the properties of a light-emitting device prepared by using the composite light-emitting material of the present invention. Therefore, the composite light-emitting material of the present invention can be effectively used as a phosphor such as an LED which requires a light-emitting material having high emission efficiency and prolonged lifetime.

Although the present invention has been described herein with reference to the foregoing exemplary embodiments, these exemplary embodiments do not serve to limit the scope of the present invention. Accordingly, those skilled in the art to which the present invention pertains will appreciate that various modifications, additions, and substitutions are possible, without departing from the scope and spirit of the accompanying claims.

What is claimed is:

1. A composite light-emitting material comprising two or more light-emitting materials selected from an inorganic phosphor, a semiconductor nanocrystal and an organic dye, in which surfaces of the two or more light-emitting materials are coated,
wherein the composite light emitting material comprises a core material comprising the inorganic phosphor or the semiconductor nanocrystal, and a transparent coating layer comprising one or both of the semiconductor nanocrystal and the organic dye dispersed in a matrix of another material.

2. The composite light-emitting material according to claim 1, comprising the organic dye and the semiconductor nanocrystal disposed in a transparent metal oxide matrix.

3. The composite light-emitting material according to claim 2, wherein the transparent metal oxide is selected from the group consisting of titanium oxide, niobium oxide, hafnium oxide, indium oxide, tungsten oxide, tin oxide and zinc oxide.

4. The composite light-emitting material according to claim 1, wherein the matrix comprises a metal oxide or a polymer.

5. The composite light-emitting material according to claim 4, wherein the polymer is one or more selected from the group consisting of polycarbonate, polyvinyl carbazole, polymethyl methacrylate, polystyrene, and polyethylene terephthalate.

6. The composite light-emitting material according to claim 1, wherein the transparent coating layer comprises a semiconductor nanocrystal in a transparent metal oxide matrix.

7. The composite light-emitting material according to claim 1, wherein the transparent coating layer comprises an organic dye in a transparent metal oxide matrix.

8. The composite light-emitting material according to claim 1, wherein the transparent coating layer comprises an organic dye and a semiconductor nanocrystal in a transparent metal oxide matrix.

9. The composite light-emitting material according to claim 1, wherein the semiconductor nanocrystal is coated with a transparent metal oxide.

10. The composite light-emitting material according to claim 9, wherein the transparent coating layer comprises a semiconductor nanocrystal coated with the transparent metal oxide in a transparent metal oxide matrix.

11. The composite light-emitting material according to claim 9, wherein the transparent coating layer comprises a semiconductor nanocrystal coated with the transparent metal oxide in a transparent metal oxide matrix containing an organic dye.

12. The composite light-emitting material according to claim 1, wherein the semiconductor nanocrystal is coated with a transparent metal oxide containing an organic dye.

13. The composite light-emitting material according to claim 12, wherein the transparent coating layer comprises a semiconductor nanocrystal coated with the transparent metal oxide containing an organic dye in a transparent metal oxide matrix.

14. The composite light-emitting material according to claim 12, wherein the transparent coating layer comprises a semiconductor nanocrystal and an organic dye coated with the transparent metal oxide containing an organic dye in a transparent metal oxide matrix.

15. The composite light-emitting material according to claim 1, wherein the semiconductor nanocrystal is selected from the group consisting of a II-VI family compound, a III-V family compound, a IV-VI family compound, a IV family compound, and a mixture thereof.

16. The composite light-emitting material according to claim 15, wherein the II-VI family compound is selected from the group consisting of CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe.

17. The composite light-emitting material according to claim 15, wherein the III-V family compound is selected from the group consisting of GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb.

18. The composite light-emitting material according to claim 15, wherein the IV-VI family compound is selected from the group consisting of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, and SnPbSTe.

19. The composite light-emitting material according to claim 15, wherein the IV family compound is selected from the group consisting of Si, Ge, SiC, and SiGe.

20. The composite light-emitting material according to claim 1, wherein the organic dye is an organic metal complex or an organic substance dye.

21. The composite light-emitting material according to claim 20, wherein the organic substance dye is selected from the group consisting of coumarin, Rhodamine, phenoxazone, stilbene, terphenyl and quarterphenyl.

22. A light-emitting device comprising the composite light-emitting material according to claim 1.

23. The light-emitting device according to claim 22, wherein the light-emitting device is a light-emitting diode.

* * * * *